United States Patent [19]

Dickman et al.

[11] 4,365,405
[45] Dec. 28, 1982

[54] METHOD OF LATE PROGRAMMING READ ONLY MEMORY DEVICES

[75] Inventors: John E. Dickman, Russiaville; William B. Donley, Kokomo, both of Ind.

[73] Assignee: General Motors Corporation, Detroit, Mich.

[21] Appl. No.: 268,089

[22] Filed: May 28, 1981

[51] Int. Cl.³ ............................................. H01L 21/22
[52] U.S. Cl. .................................. 29/571; 29/576 B; 29/577 C; 29/578; 148/187
[58] Field of Search ...................... 29/571, 576 B, 578, 29/577 C; 148/187

[56] References Cited

U.S. PATENT DOCUMENTS

| | | | |
|---|---|---|---|
| 3,475,234 | 10/1969 | Kerwin et al. | 148/187 |
| 3,751,722 | 8/1973 | Richman | 357/41 |
| 3,775,191 | 11/1973 | McQuhae | 148/1.5 |
| 3,816,905 | 6/1974 | Bernard et al. | 29/571 |
| 3,914,855 | 10/1974 | Cheney et al. | 29/571 |
| 4,080,718 | 3/1978 | Richman | 29/571 |
| 4,103,415 | 8/1978 | Hayes | 29/571 |
| 4,129,936 | 12/1978 | Takei | 29/571 |
| 4,151,020 | 4/1979 | McElroy | 148/1.5 X |
| 4,198,693 | 4/1980 | Kuo | 29/571 X |
| 4,235,011 | 11/1980 | Butler et al. | 29/577 C |
| 4,267,632 | 5/1981 | Shappir | 29/571 |
| 4,294,001 | 10/1981 | Kuo | 29/576 B |
| 4,295,209 | 10/1981 | Donley | 357/91 X |
| 4,319,620 | 3/1982 | Tasch et al. | 357/23 |

Primary Examiner—G. Ozaki
Attorney, Agent, or Firm—Robert J. Wallace

[57] ABSTRACT

A method of making a ROM and encoding it late in the method. Encoding is by ion implantation. A second level of polycrystalline used for resistors outside the ROM is used as the encoding mask.

5 Claims, 12 Drawing Figures

U.S. Patent
Dec. 28, 1982
4,365,405
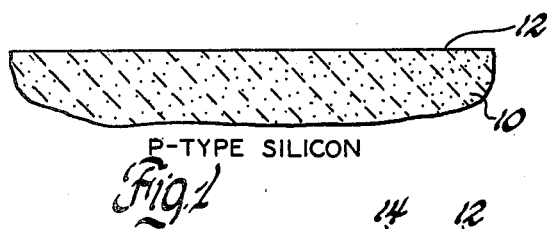
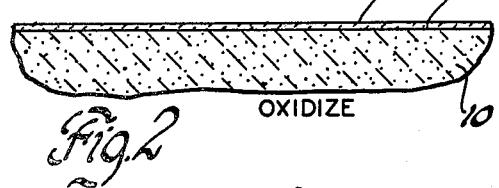
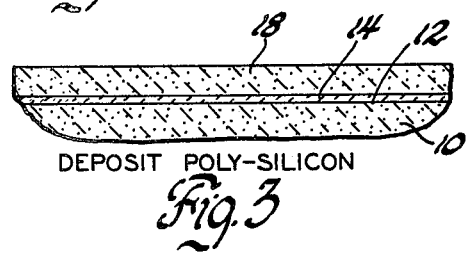
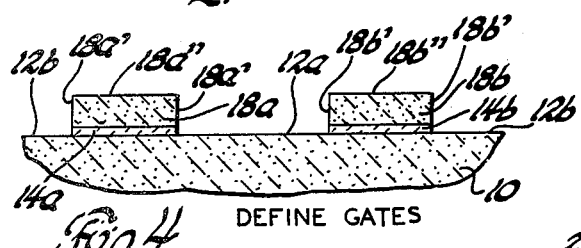
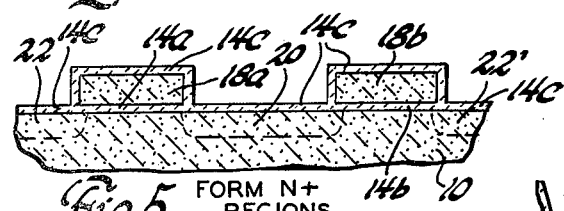
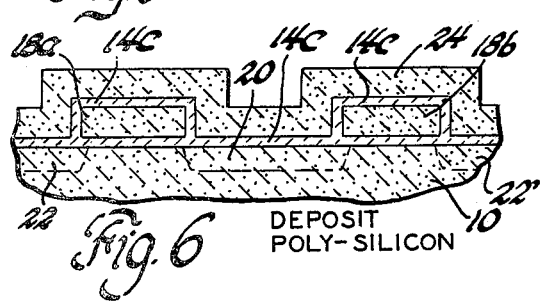
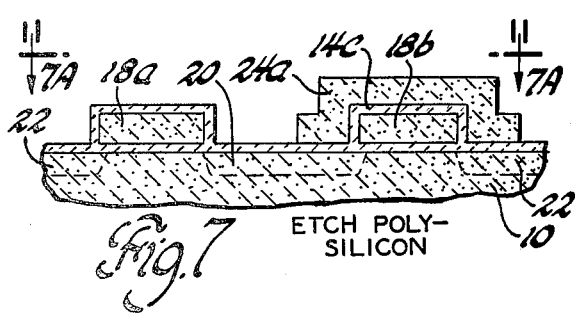
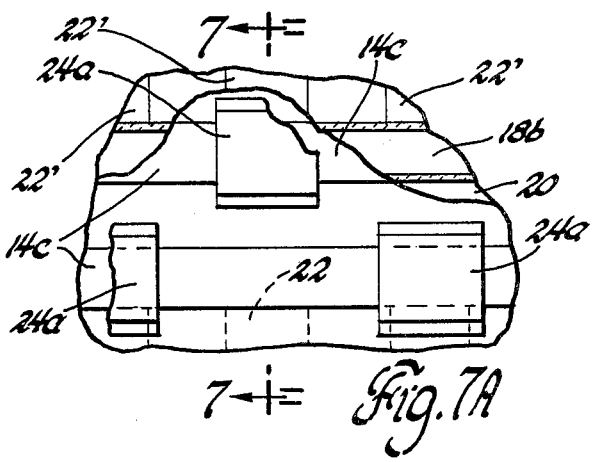
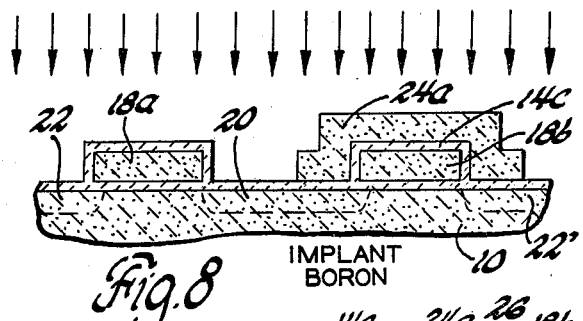
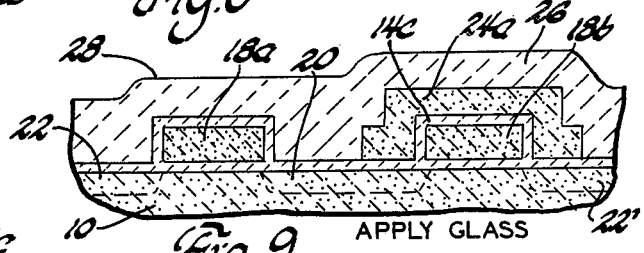
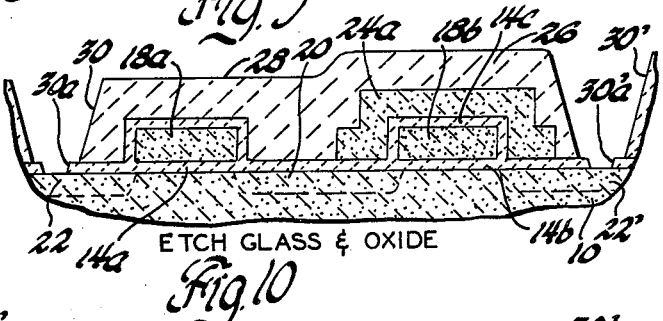
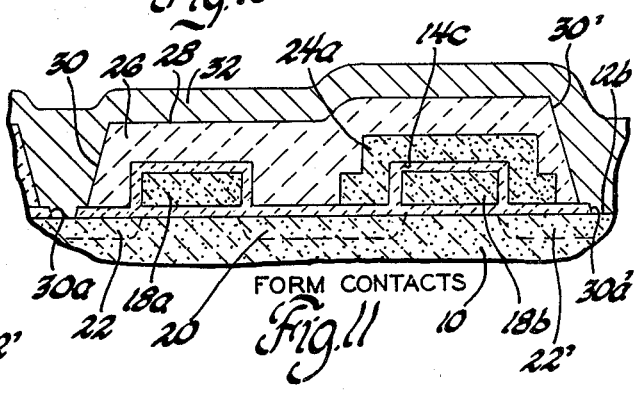

METHOD OF LATE PROGRAMMING READ ONLY MEMORY DEVICES

RELATED PATENT APPLICATIONS

This invention is related to the following patent applications that we filed herewith and are assigned to the assignee hereof:

Ser. No. 268,086 LATE PROGRAMMING ENHANCED CONTACT ROM

Ser. No. 268,090 SINGLE LEVEL POLY LATE PROGRAMMABLE ROM

Ser. No. 268,088 LATE PROGRAMMING USING A SILICON NITRIDE INTERLAYER

This invention is also related to the previously filed U.S. Ser. No. 098,211 now U.S. Pat. No. 4,295,209, that is entitled "Programming an IGFET Read-Only-Memory" and was filed Nov. 28, 1979.

FIELD OF THE INVENTION

This invention relates to a method of late programming a read-only memory (ROM) on a semiconductor chip by ion implantation through polycrystalline silicon ROM gates. More specifically, it involves blocking selected ROM gates from a blanket ion implantation by means of a mask formed by a second level polycrystalline silicon layer. The second level polycrystalline silicon layer ideally would already be present on the chip as part of other active or passive devices.

BACKGROUND OF THE INVENTION

The above-mentioned U.S. Pat. No. 4,295,209 late programming an IGFET ROM by ion implantation. By IGFET, we mean an insulated gate field effect transistor. The ROM comprises an orderly array of such transistors. The IGFETs are ordinarily arranged on a common silicon substrate in a pattern such that the gates of individual transistors are aligned in a number of parallel input rows. The drains of individual devices are aligned in a plurality of parallel columns. In a typical array of horizontal-type IGFETs, all IGFET drains can be contacted by a metallization pattern of parallel conductor output strips that overlie and, in plan view, are orthogonal to a pattern of parallel polycrystalline silicon gate input strips.

The aforementioned U.S. Pat No. 4,295,209 discloses programming the ROM by ion implantation through the polycrystalline silicon gate strips just before metallization, using a reflowable glass layer as a mask. In substance, all ROM gates are potentially active when the polycrystalline silicon gate strips are defined. A blanket silicon nitride coating is applied over all the polycrystalline silicon gate strips, and contact openings etched in it. A blanket reflowable glass coating is applied over the silicon nitride coating, and corresponding contact openings etched in it. However, concurrently, ion implant windows are also etched in the glass coating, over selected ROM gates. No additional masks are needed to perform the ion implantation since two masks are ordinarily needed anyway, to etch first through the glass and then through the underlying thermal oxide. The silicon nitride coating provides an insulating coating over the gate strip portion exposed within the ion implant window. Accordingly, metal drain strips can be applied over the glass in the usual manner. They can pass directly over the selected gate ion implant windows without electrically shorting to the gate strip in the window. Thus, not only is the late programming achieved but high ROM layout density is preserved.

On the other hand, in U.S. Pat. No. 4,295,209 the metal drain strips and the gate strip portions overlap within the ion implant windows with only a thin layer of dielectric therebetween. This generates a parasitic capacitance. In small ROM arrays the cumulative effect of this parasitic capacitance is not particularly significant. However, in large ROM arrays it can accumulate sufficiently to significantly slow down ROM operating speed.

We have now discovered how to minimize this parasitic capacitance but still obtain late programming, without increasing ROM size. In the aforementioned patent application Ser. No. 268,090 we propose to obtain both minimum parasitic capacitance and high ROM density by applying the U.S. Pat. No. 4,295,209 programming process to a ROM of unique configuration. In the aforementioned patent application Ser. No. 268,088 we propose using a silicon nitride etch mask as an ion implantation mask, whereby the subsequently applied phosphosilicate glass layer need not be removed over IGFET channels, to minimize parasitic capacitance. In the aforementioned patent application Ser. No. 268,086, we propose to program before the glass layer is applied by using an enhancement contact mask in combination with a second level polycrystalline silicon layer. In the programming technique of the present patent application, we propose to program using a second level of polycrystalline silicon in still a different way. The two programming techniques of Ser. No. 268,086 and the present application are particularly useful in making integrated circuits that would otherwise incorporate a second level of polycrystalline silicon for other purposes. In such instance, these techniques provide programming capability late in the process of manufacture without (a) adding another mask to the number of masks already needed to produce that product, (b) altering conventional processes, (c) expanding ROM size, or (d) decreasing ROM speed.

OBJECTS AND SUMMARY OF THE INVENTION

It is, therefore, an object of this invention to provide an improved late programming manufacturing method for an IGFET ROM, that permits both minimal capacitance and high density to be achieved.

Another object of the invention is to provide an improved late programming technique for a ROM in which a second level of polycrystalline silicon is used as an ion implantation mask.

Another object is to provide a high speed and high density ROM programmed late in its process of manufacture, without adding an extra mask to perform the programming.

This invention comprehends forming a ROM array of IGFETs on a silicon surface. Each IGFET is operable in that it has a source and drain region, a channel region and a polycrystalline silicon gate electrode. The gate electrode is readily penetrable by an ion beam. The ROM is programmed by covering the gate electrodes of selected IGFETs with a protective second level polycrystalline silicon. The silicon surface is then given a blanket ion implantation to significantly change threshold voltage of the balance of the ROM IGFETs not protected by the second level of polycrystalline silicon. The ion implantation is performed at an energy insufficient to penetrate the two levels of polycrystalline silicon. In a preferred embodiment, the photoresist used to delineate the second level of polycrystalline silicon is not removed before the ion implantation. This provides an added layer of protection, and permits higher implantation energies to be used. A thick blanket insulating layer is then deposited onto the ROM array and contact windows etched in it. A conductor pattern, such as drain lines, is then formed on the insulating layer, and a passivation coating applied over the conductor pattern. The second level polycrystalline silicon coating is preferably a layer already used on the silicon surface for other devices such as resistors or capacitors in a random-access memory.

BRIEF DESCRIPTION OF THE DRAWING

Other objects, features and advantages of this invention will become more apparent from the following description of preferred examples thereof, and from the drawings.

FIGS. 1-7 and 8-11 show a series of sectional views along the same plane through two IGFET areas of a read-only memory (ROM) integrated circuit. These views show progressive stages in the manufacture of that integrated circuit. For clarity, background lines are omitted.

FIG. 7A shows a plan view of FIG. 7, with parts broken away to show underlying layers.

FIG. 7 shows a sectional view along the line 7—7 of FIG. 7A.

DESCRIPTION OF THE PREFERRED EMBODIMENTS

Reference is now made to the drawing, in which fabrication of two adjacent IGFETs is described. It is to be understood that these two IGFETs form merely one part of a matrix of IGFETs comprising a read-only memory such as hereinbefore described. It is to be understood that an IGFET read-only memory is a matrix comprising hundreds and even thousands of IGFETs arranged in an array of columns and rows, with adjacent rows of IGFETs sharing the same source region. All the IGFETs in the same row share the same gate electrode. In a typical arrangement, the source regions of all IGFETs in a row are electrically in parallel by extending the source diffusion region between adjacent IGFET pairs in the row. In such instance, the integrated source regions appear as an elongated strip. To conserve space the same strip-like source region diffusion also serves as a source region for an adjacent row of IGFETs. In the FIG. 7A plan view, the resultant configuration appears as a strip-like diffusion area lying between two parallel gate electrodes. A discrete drain region is diffused in the wafer surface for each IGFET pair along the outer edges of the gate electrode pairs. The drain regions are aligned in columns. In section, two adjacent IGFETs appear as shown in FIGS. 1-11.

It is also to be recognized that the ROM IGFETs are typically formed on a mesa upstanding on the silicon surface, surrounded by more highly doped silicon surface areas that are covered by a relatively thick overlying field oxide. Such a construction is shown in U.S. Pat. No. 3,751,722 Richman. However, to focus attention more clearly on the programming improvement of this invention, and how ion implantation is associated with an overlying second level of polycrystalline silicon, applicants have elected to omit showing the mesa construction and the surrounding thick field oxide in FIGS. 1-11. However, in FIG. 7A, all of the silicon surface occupied by the source region, drain regions and gate electrode is a mesa. The balance is covered by a field oxide about 0.5-1.5 micrometers thick that overlies a more highly doped P-type surface region.

FIG. 1 shows a fragment of a mesa on a P-type silicon chip 10 where an IGFET pair from two adjacent ROM rows is to be formed. Chip 10 is one of many chips integrally formed in a repetitive pattern on a monocrystalline silicon wafer (not shown). The wafer has a diameter of about 7-10 centimeters and a thickness of about 0.4-0.6 millimeter. The wafer and therefore chip 10, would typically be homogeneous and has a resistivity of about 5-30 ohm-centimeters. The particular resistivity of course will depend on electrical characteristics of the finished devices desired. The wafer thickness preferred is ordinarily a function of the wafer diameter, with 7.6 centimeter wafers usually being about 0.4 millimeter thick.

Upper surface 12 of the silicon wafer containing chip 10 is lapped, polished and cleaned in the normal and accepted manner. A thin layer 14 of silicon dioxide, preferably about 500-1000 Angstroms thick is then formed on surface 12 of chip 10 as shown in FIG. 2. The thin silicon dioxide layer 14 can be formed by heating the silicon wafer containing chip 10 in dry or wet oxygen at a temperature of about 900°-1100° C. until the layer of silicon dioxide thickness is obtained. Time and treatment will depend upon the thickness desired and precise temperature of the treatment. However, a thickness of about 1000 Angstroms can be formed by heating in a dry oxygen of about 1 hour at a temperature of about 1050° C. This forms a thin silicon dioxide layer 14 which is suitable as a gate dielectric in an IGFET and which is readily penetrable by an ion beam having an energy greater than about 75 keV.

If desired, the wafer can then be given an ion implantation to adjust threshold voltage of the devices that are subsequently to be formed. Implantation with $^{11}B^+$ at a dosage of about $2\times 10^{11}$ ions per square cm at about 35-75 keV is an example of what might be used. However, the particular dopant, dosage and power used can be varied as should be understood, depending upon the particular resistivity of the wafer, gate oxide thickness used, and threshold voltage desired in the resultant devices. Since such an implantation is optional, it is not shown in the drawing.

A blanket layer 18 of polycrystalline silicon is then deposited on the silicon dioxide layer 14 as shown in FIG. 3. The polycrystalline silicon layer 18 can be formed by chemical vapor deposition, evaporation, sputtering or the like. In general, it would have a thickness of about 4000-7000 Angstroms for self-aligning gate purposes. At least 4000 Angstroms is generally needed to obtain a low resistance gate. Above about 7000 Angstroms in thickness, the polycrystalline silicon layer produces undesirably high step heights. Also, thicknesses above 7000 Angstroms may require ion beam energies greater than about 150-200 keV to penetrate them. It should be recognized that the polycrystalline silicon layer 18 will be subsequently etched into a pattern of parallel bars that must be orthogonally crossed by an overlying metallization pattern.

The polycrystalline silicon layer 18 is preferably undoped, i.e., intrinsic, as deposited and then subsequently doped with an N-type impurity during the diffusion step which forms source and drain regions 20, 22 and 22' in one of the succeeding process steps. It is preferred to dope the polycrystalline silicon layer 18 after it is deposited with phosphorus to a sheet resistivity of 20-50 ohms per square. On the other hand, there is no objection to so doping the polycrystalline silicon while it is being deposited. It is simply unnecessary. It should also be recognized that ion implantation can be used instead of diffusion to dope the polycrystalline silicon layer 18 and form the source and drain regions 20, 22 and 22'.

Referring now to FIG. 4 the undoped polycrystalline silicon layer 18 and the silicon dioxide layer 14 are then successively photolithographically etched to define discrete gate electrodes 18a and 18b, each of which has an underlying gate dielectric 14a and 14b. Gate electrode 18a has exposed sides 18a' and top 18a". Gate electrode 18b has exposed sides 18b' and top 18b". Layers 18 and 14 can be successively etched in much the same way as described in U.S. Pat. No. 3,475,234 Kerwin et al. For example, polycrystalline silicon layer 18 can be delineated by appropriately photomasking the wafer containing chip 10, and then immersing it in a mixture of hydrofluoric, nitric and acetic acids saturated with iodine. In the alternative, it can be plasma etched with $CF_4$ containing $O_2$. It is then rinsed in a hydrofluoride based etchant to remove the silicon dioxide layer over surface areas 12a and 12b. However, the particular manner in which the gate dielectric and the electrode are defined forms no part of this invention.

As can be seen better in FIG. 7A, gate electrodes 18a and 18b are in fact parallel strips of polycrystalline silicon. Surface 12a, and its underlying coextensive source region 20, is a continuous strip extending over the entire area between gate electrodes 18a and 18b. Gate electrodes 18a and 18b cover contiguous strips of surface 12 on opposite sides of surface strip 12a. Chip surface areas 12b are contiguous the surface strips covered by gate electrodes 18a and 18b. However, they are not strips. Instead, they are discrete rectangular areas when observed in plan view. Because background lines are not used in FIGS. 1-11, the individual surface areas 12b appear therein to be the same as the strip-like surface area 12a. However, many identical rectangular areas 12b would be spaced along the length of gate electrodes 18a and 18b. The individual rectangular areas are paired on opposing sides of gate electrodes 18a and 18b. The surface area under gate electrodes 18a and 18b, and the contiguous surface areas 12a and 12b all form one continuous mesa. The balance of the surface shown is covered by a thermally grown silicon dioxide field layer about 0.5-1.5 micrometers thick. When defining the gate electrodes 18a and 18b and the gate dielectric 14a and 14b, polycrystalline silicon layer 18 is removed from the field oxide. The field oxide is reduced only slightly in thickness, so that it still provides an effective diffusion mask for the next process step.

In the next process step, phosphorus is diffused into the gate electrodes 18a and 18b, and into the exposed surface portions 12a and 12b of chip 10. This produces a strip-like source region 20 and a plurality of discrete rectangular drain regions 22 and 22', as indicated in the preceding paragraph. The phosphorus can be deposited onto and slightly diffused into the wafer by placing the wafer in a furnace maintained at a temperature of 950°-1050° C. About 3.5 liters per minute argon and 10-50 cc per minute oxygen flows through the furnace. After a 5 minute wafer preheat additional argon is bubbled through the phosphorus oxychloride at about 1° C. and bled into the furnace atmosphere at a rate of 10-100 cubic centimeters per minute. After a 5 minute period, the additional argon flow is discontinued. The wafer is left in the furnace for a third 5 minute period as a post-bake step. The wafer is heated to a temperature of 900°-1050° C. for about ½-2 hours in a moderately to strongly oxidizing atmosphere, to drive-in the phosphorus. The particular times, temperatures and atmospheres used for deposition and drive-in are obviously a matter of choice and are principally determined by the electrical characteristics of the device desired. Concurrently, a thin silicon dioxide coating 14c is reformed over the surface portions 12a and 12b, and also over the sides 18a' and 18b' and upper surfaces 18a" and 18b" of the polycrystalline silicon gate electrodes 18a and 18b. This coating 14c will range in thickness from about 100-1000 Angstroms and is of a thickness primarily to prevent deterioration of surface portions 12a and 12b during the aforementioned drive-in. The resultant product is as shown in FIG. 5.

FIG. 6 shows the next step of our method. A second blanket layer of polycrystalline silicon 24 is deposited over the entire wafer containing chip 10. This second polycrystalline layer 24 can be deposited in the same manner as previously mentioned for the first polycrystalline silicon layer 18. In general, we would prefer that this layer be a layer that is also used in forming other active or passive devices on the same silicon chip but in another area. We prefer that this layer have a thickness of approximately 4000-7000 Angstroms. In this invention this polycrystalline silicon layer 24 is to be used as an ion implant blocking layer. Accordingly, we would prefer that it be closer in thickness to 7000 Angstroms than 4000 Angstroms. However, as previously mentioned, we would not desire that this thickness be appreciably greater than 7000 Angstroms because it could produce undesirably high steps that must be crossed by the subsequently applied metallization pattern 32.

In this invention the second polycrystalline silicon layer 24 can be used doped or undoped. It depends on what other purpose, if any, the second polycrystalline silicon layer 24 is to serve on the chip 10. If it is to serve no other purpose, it can be deposited undoped, and left undoped. If, for example, it is to also form a resistor elsewhere on chip 10, one can dope layer 24 precisely as needed for resistor purposes. The doping could be performed in the same manner as one would otherwise dope the layer for resistor purposes. For example, the polycrystalline silicon layer 24 can be doped as deposited to a resistance of approximately 20 ohms per square. In the alternative, one might choose to use ion implantation to achieve this same resistance. In such event, of course, the energy used should be insufficient to allow the dopant to pass through the polycrystalline silicon layer 24, as for example about 75-125 keV.

Thereafter the second polycrystalline silicon layer 24 is photolithographically masked and etched, to define a plurality of patches 24a that completely cover selected IGFET gates in the ROM as can be seen by reference to FIGS. 7 and 7A. As can be observed, each patch 24a completely covers the gate, i.e., the channel region, of each IGFET which is desired to be a "1" in the resultant ROM code. The manner in which polycrystalline silicon layer 24 is delineated is not particularly significant. As with the first level polycrystalline silicon layer 18, the second level polycrystalline silicon layer 24 can be wet etched with a mixture of hydrofluoric, nitric and acetic acids saturated with iodine, or plasma-etched with $CF_2$ containing $O_2$. The photoresist (not shown) used to delineate polycrystalline silicon layer 24 into the patches 24a, is preferably left on patches 24a for the ion implantation step which follows next. Leaving the photoresist on provides an added insurance that the ion implantation will not significantly penetrate gate electrode 18b. It is to be appreciated that up to this point in our process, all ROM gates are still operative. In the next step, all those gates not protected by a patch 24a are to be permanently turned off, and the ROM thereby encoded.

The wafer is then given a blanket ion implant as shown in FIG. 8. Implantation is performed with $^{11}B^+$ in a dosage of about $5 \times 10^{13}$ ions per square centimeter at an energy of about 150 keV. Any energy sufficient to penetrate the exposed gate electrode 18a can be used, as for example at least about 75–125 keV, depending on the thickness of gate electrode 18a. Any dosage can be used that will raise threshold voltage of the channel under gate 18a to a voltage above the operating voltage selected for gate electrode 18a. The particular dosage needed will vary, of course, depending upon the operating potential selected for the gate electrode, the initial resistivity of the silicon wafer, gate oxide thickness, etc. In substance, one desires a dosage and energy sufficient to change the threshold voltage of the uncovered IGFETs to such an extend that they are unresponsive to a predetermined gate voltage. They would thus constitute a "0" in the ROM code. In the present example, we would raise threshold voltage of the uncovered IGFETs to a level significantly above the normal gate operating voltage of the ROM. For example, if the gate operating voltage of the ROM is approximately 5 volts, one would want to raise the threshold voltage of the uncovered IGFETs to 7 or 8 volts or even higher. Still further, while we describe implanting the affected gate with $B^{11}$, it is recognized that other P-type impurities could be used to increase IGFET channel P-type doping, and the attendant IGFET threshold voltage.

The maximum ion implantation energy that can be used will be a function of the combined thickness of polycrystalline silicon layers 18 and 24, and of the photoresist if it is used. If the photoresist is left on patches 24a, an ion implantation energy of up to 175 or 200 keV might be used. Otherwise, one would choose to limit the ion implantation energy to about 125–150 keV.

It should also be recognized that if this example were a p-channel IGFET, instead of an n-channel IGFET, one would want to implant the channel with an N-type impurity to raise threshold voltage. Analogously the ROM described in this example of the invention comprises an array of enhancement-type IGFETs. One might choose to make a ROM array using depletion-type IGFETs.

If the photoresist used in delineating patches 24a was left on during ion implantation, it is removed. A relatively thick blanket layer of phosphorus doped glass 26 is then deposited onto the wafer containing chip 10. The wafer is then heated to reflow the glass and provide a smooth upper surface 28 on glass layer 26 as shown in FIG. 9. The blanket glass layer 26 can be deposited in any convenient manner, as for example by chemical vapor deposition of silane and phosphine. Any of the known and accepted practices and glass-like materials used to passivate and smooth out the surface of IGFET ROMs can be used in this invention too. The minimum thickness of glass which is needed to smooth out the upper surface of the wafer will vary. However, a thickness of about 5000 to 15,000 Angstroms is preferred. This is the same thickness that would be applied to integrated circuits whether this invention was used or not.

As mentioned, the glass layer 26 is of a composition which is reflowed to provide a smoother surface 28 on which to subsequently deposit a metallization pattern. Any silicate serving this function is considered a glass for purposes of this invention. It is preferred to use a glass having a melting point temperature that permits reflow at about 1000°–1100° C. in about 10 minutes. Higher temperatures and/or longer periods of time are generally not desired since they can produce additional unwanted diffusion of regions 20, 22 and 22' within chip 10.

Next, the glass layer 26 is photolithographically masked to open contact windows in it over the source and drain regions. The contact window to the source region 20 is not shown since it is not in the field of view in the drawing. Glass layer 26 is etched in the normal and accepted manner, as for example with a hydrofluoric acid-based etchant. When the etchant has penetrated glass layer 26 and underlying thermal oxide 14c exposed, etching is terminated. The wafer is then rinsed and remasked. The second mask is similar to the first but provides slightly smaller contact openings, to inhibit lateral etching of glass layer 26 when etching through the more slowly etchable thermal oxide 14c. The wafer is then immersed again in a hydrofluoric acid based etchant. After windows 30a and 30a' are opened in the thermal oxide 14c, etching is terminated. Any other contacts needed for the resultant circuitry on the chip can also be opened while windows 30, 30', 30a and 30a' are opened. However, the glass coating 26 is otherwise left continuous over the ROM array.

A metallization pattern 32 is then formed on the upper surface 28 of glass layer 26 as shown in FIG. 11. Any of the normal and accepted metals and methods of forming the pattern can be used. For example, the metallization pattern can be formed by evaporating a blanket layer of aluminum onto the entire upper surface of the slice. The metal layer fills the contact windows, including contact windows 30, 30', 30a and 30a' for drain regions 22 and 22'. The metal contacts the wafer surfaces 12a (not shown) and 12b to make a low resistance electrical connection with a source region 20 and drain regions 22 and 22'. Other metals than pure aluminum can be used in forming the metallization pattern 32. Any of the normal and accepted metals can be used, as for example, aluminum-silicon alloy, gold, silver, alone or in a multiplicity of layers, just as in any other ROM.

The blanket metal layer used in forming the metallization pattern 32 can be photolithographically etched in a normal and accepted manner to define source and drain electrodes. Since the source electrode is not in the plane of FIG. 11, it is not shown. The drain electrode is, in fact, a strip running along a column of drain regions in the ROM array, orthogonal to gate electrodes 18a and 18b. Since the drain regions are arrayed in parallel columns, the drain strips are a pattern of parallel strips, as previously indicated.

The embodiments of the invention in which an exclusive property or privilege is claimed are defined as follows:

1. A method of making a high speed and high density read-only memory, and encoding it in later steps of the method comprising:

forming on a semiconductor surface, an operative IGFET array having an overlying gate electrode pattern formed by a first level of polycrystalline silicon;

covering channels of predetermined IGFETs in said array with a second level of polycrystalline silicon and leaving the balance of array IGFET channels uncovered;

significantly selectively altering threshold voltage of said balance of IGFET channels by blanket ion implantation of said array at an energy insufficient to penetrate both levels of said polycrystalline silicon, effective to render said channels unresponsive at an intended gate electrode operating voltage;

covering said array with an insulating coating and etching array contact windows in it while maintaining coating thickness over said channels; and forming an array output conductor pattern on said insulating coating, whereby said pattern crosses gate electrodes over said channels without incurring significant parasitic interaction therewith.

2. A method of making a high speed, high density read-only memory, and encoding it in later steps of the method comprising:

forming on a silicon chip, an operative IGFET array having an overlying gate electrode pattern formed by a first level of polycrystalline silicon;

covering channels of predetermined IGFETs in said array with a second level of polycrystalline silicon that is also used elsewhere on said chip in forming a resistor, and leaving the balance of array IGFET channels uncovered;

significantly selectively raising threshold voltage of said balance of IGFET channels by unselective ion implantation of said array below an energy sufficient to penetrate both polycrystalline silicon levels, effective to encode said array;

covering said array with a phosphosilicate glass coating and etching array contact windows in it without concurrently etching windows in it over said channels; and forming a metal pattern on said phosphosilicate insulating glass coating for contacting all IGFET drain regions in said array, wherein said pattern crosses said gate electrode pattern over said channels with only minimal parasitic capacitance being incurred.

3. A method of making a high speed, high density read-only memory on a silicon surface, and encoding it using a mask for defining polycrystalline resistors used elsewhere on the same silicon surface, said method comprising:

forming on a silicon chip a read-only memory array of IGFETs, all having polycrystalline silicon gate electrodes and all having substantially the same threshold voltage;

depositing a blanket second layer of polycrystalline silicon onto said chip in a thickness sufficient not only to serve as a resistor but also to serve as an ion blocking layer;

etching said second polycrystalline silicon layer not only to define said resistors but also to define protective patches over channels of predetermined IGFETs in said array;

encoding said array by giving said chip an ion implantation to raise threshold voltage of all array IGFETs whose channels are not covered by said protective patches;

depositing a phosphosilicate glass coating onto said chip and etching array contact windows in it without concurrently etching windows in it over said channels; and forming an array output conductor pattern on said phosphosilicate glass coating, whereby said pattern crosses said gate electrodes over said channels while maintaining minimal parasitic capacitance.

4. A method of making a high speed, high density read-only memory and a random-access memory on one silicon chip, and encoding the former memory in later steps of the method without introducing an additional mask for encoding, said method comprising:

forming on a silicon chip a self-aligned polycrystalline silicon gate IGFET read-only memory by initial steps used to also make a random-access memory on the same chip and which includes deposition of a first layer of polycrystalline silicon;

depositing a blanket second layer of polycrystalline silicon onto said chip;

etching the latter layer not only to define resistors for the random-access memory but also to leave patches of the latter layer covering channels of predetermined IGFETs in said read-only memory;

encoding said read-only memory by blanket ion implantation of said chip at an energy sufficient to penetrate said first layer of polycrystalline silicon but insufficient to penetrate both polycrystalline silicon levels;

covering said array with a phosphosilicate glass coating and etching array contact windows in it without concurrently etching windows in it overchannels; and forming a metal pattern on said insulating coating that includes an output pattern for said read-only memory that incurs only minimal parasitic capacitance when crossing over IGFET channels therein.

5. A method of making a high speed, high density n-channel read-only memory and an n-channel random-access memory on one silicon chip, and encoding the former memory in later steps of the method without introducing an additional mask for encoding, said method comprising:

forming on a silicon chip a self-aligned polycrystalline silicon gate IGFET read-only memory by initial steps used to also make a random-access memory on the same chip and which includes deposition of a first layer of polycrystalline silicon;

depositing a blanket second layer of polycrystalline silicon onto said chip;

forming an etch mask on said chip to define the second polycrystalline silicon layer into resistors for the random-access memory and ion implantation protective patches for the read-only memory;

before removing the etch mask, implanting said chip with boron ions at an energy of about 175–200 keV that will only penetrate an unprotected first polycrystalline layer, and thereby raise threshold voltage of unprotected IGFET channels in said read-only memory above a predetermined operating value;

removing said etch mask and depositing a phosphosilicate glass coating onto said chip over said memories;

etching memory contact windows in the phosphosilicate glass coating without concurrently etching windows in it over memory IGFET channels; and forming a metal pattern on said insulating coating, that includes an output pattern for said read-only memory that incurs only minimal parasitic capacitance when crossing over IGFET channels therein.

* * * * *